United States Patent
Ganguly et al.

(10) Patent No.: US 10,304,814 B2
(45) Date of Patent: May 28, 2019

(54) I/O LAYOUT FOOTPRINT FOR MULTIPLE 1LM/2LM CONFIGURATIONS

(71) Applicant: Intel Corporation, Santa Clara, CA (US)

(72) Inventors: Konika Ganguly, Portland, OR (US); Robert J. Royer, Jr., Portland, OR (US); Rebecca Z. Loop, Hillsboro, OR (US); Anthony M. Constantine, Portland, OR (US); Bilal Khalaf, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/640,148

(22) Filed: Jun. 30, 2017

(65) Prior Publication Data
US 2019/0006340 A1  Jan. 3, 2019

(51) Int. Cl.
*G11C 14/00* (2006.01)
*H01L 23/50* (2006.01)
*H01L 25/18* (2006.01)
*H01L 23/498* (2006.01)

(52) U.S. Cl.
CPC .......... *H01L 25/18* (2013.01); *G11C 14/0009* (2013.01); *H01L 23/49816* (2013.01); *H01L 23/50* (2013.01)

(58) Field of Classification Search
CPC .............................. H01L 25/18; H01L 25/50
See application file for complete search history.

(56) References Cited

U.S. PATENT DOCUMENTS

| | | | |
|---|---|---|---|
| 5,912,839 | A | 6/1999 | Ovshinsky et al. |
| 6,035,432 | A | 3/2000 | Jeddeloh |
| 6,292,874 | B1 | 9/2001 | Barnett |
| 7,590,918 | B2 | 9/2009 | Parkinson |
| 7,600,078 | B1 | 10/2009 | Cen et al. |
| 7,756,053 | B2 | 7/2010 | Thomas et al. |
| 7,913,147 | B2 | 3/2011 | Swaminathan et al. |

(Continued)

FOREIGN PATENT DOCUMENTS

| CN | 1100540 A | 3/1995 |
|---|---|---|
| CN | 101079003 A | 11/2007 |

(Continued)

OTHER PUBLICATIONS

"Phase change memory-based 'moneta' system points to the future of computer storage", ScienceBlog, Jun. 2, 2011, 7 pgs.

(Continued)

*Primary Examiner* — William A Harriston
(74) *Attorney, Agent, or Firm* — Compass IP Law PC

(57) ABSTRACT

An apparatus is described. The apparatus includes a package on package structure. The package on package structure includes an upper package and a lower package. One of the packages contain memory devices of a first type and the other of the packages contain memory devices of a second type. I/O connections on the underside of the upper package's substrate are vertically aligned with their corresponding, first I/O connections on the underside of the lower package's substrate. The first I/O connections are located outside second I/O connections on the underside of the lower package's substrate for the lower package.

19 Claims, 12 Drawing Sheets

(56) References Cited

U.S. PATENT DOCUMENTS

| | | | |
|---|---|---|---|
| 8,051,253 | B2 | 11/2011 | Okin et al. |
| 8,462,537 | B2 | 6/2013 | Karpov et al. |
| 8,462,577 | B2 | 6/2013 | Zeng et al. |
| 8,463,948 | B1 | 6/2013 | Qawami et al. |
| 8,605,531 | B2 | 12/2013 | Kau |
| 8,607,089 | B2 | 12/2013 | Qawami et al. |
| 8,612,676 | B2 | 12/2013 | Dahlen et al. |
| 8,612,809 | B2 | 12/2013 | Casper et al. |
| 8,626,997 | B2 | 1/2014 | Qawami et al. |
| 8,649,212 | B2 | 2/2014 | Kau et al. |
| 8,838,885 | B2 * | 9/2014 | Kwak ................ G06F 12/0246 257/678 |
| 8,838,935 | B2 | 9/2014 | Hinton et al. |
| 9,087,584 | B2 | 7/2015 | Dahlen et al. |
| 9,342,453 | B2 | 5/2016 | Nale et al. |
| 9,378,133 | B2 | 6/2016 | Nachimuthu et al. |
| 9,378,142 | B2 | 6/2016 | Ramanujan et al. |
| 9,430,372 | B2 | 8/2016 | Nachimuthu et al. |
| 9,529,708 | B2 | 12/2016 | Puthiyedath et al. |
| 9,600,407 | B2 | 3/2017 | Faber |
| 9,600,416 | B2 | 3/2017 | Ramanujan et al. |
| 9,619,408 | B2 | 4/2017 | Nale et al. |
| 9,690,493 | B2 | 6/2017 | Dahlen et al. |
| 2005/0273584 | A1 | 12/2005 | Wisecup et al. |
| 2007/0005922 | A1 | 1/2007 | Swaminathan et al. |
| 2007/0255891 | A1 | 11/2007 | Chow et al. |
| 2008/0016269 | A1 | 1/2008 | Chow et al. |
| 2008/0034148 | A1 | 2/2008 | Gower et al. |
| 2008/0082766 | A1 | 4/2008 | Okin et al. |
| 2008/0235443 | A1 | 9/2008 | Chow et al. |
| 2008/0270811 | A1 | 10/2008 | Chow et al. |
| 2009/0119498 | A1 | 5/2009 | Narayanan |
| 2009/0313416 | A1 | 12/2009 | Nation |
| 2010/0131827 | A1 | 5/2010 | Sokolov et al. |
| 2010/0291867 | A1 | 11/2010 | Abdulla et al. |
| 2010/0293317 | A1 | 11/2010 | Confalonieri et al. |
| 2010/0306446 | A1 | 12/2010 | Villa et al. |
| 2010/0306453 | A1 | 12/2010 | Doller |
| 2010/0318718 | A1 | 12/2010 | Eilert et al. |
| 2011/0047365 | A1 | 2/2011 | Hentosh et al. |
| 2011/0060869 | A1 | 3/2011 | Schuette |
| 2011/0153916 | A1 | 6/2011 | Chinnaswamy et al. |
| 2011/0291884 | A1 | 12/2011 | Oh et al. |
| 2012/0317332 | A1 * | 12/2012 | Kwak ................ G06F 12/0246 711/102 |
| 2013/0268741 | A1 | 10/2013 | Daly et al. |
| 2013/0275661 | A1 | 10/2013 | Zimmer et al. |
| 2013/0282967 | A1 | 10/2013 | Ramanujan |
| 2013/0290597 | A1 | 10/2013 | Faber |
| 2014/0129767 | A1 | 5/2014 | Ramanujan et al. |
| 2014/0297938 | A1 | 10/2014 | Puthiyedath et al. |
| 2014/0367839 | A1 * | 12/2014 | Choi ................ H01L 23/3128 257/686 |
| 2017/0031821 | A1 | 2/2017 | Ramanujan et al. |
| 2017/0139649 | A1 | 5/2017 | Puthiyedath et al. |
| 2017/0249250 | A1 | 8/2017 | Ramanujan et al. |
| 2017/0249266 | A1 | 8/2017 | Nale et al. |

FOREIGN PATENT DOCUMENTS

| | | |
|---|---|---|
| CN | 101620539 B | 12/2013 |
| WO | 2005002060 A2 | 1/2005 |

OTHER PUBLICATIONS

"The Non-Volatile Systems Laboratory Coding for non-volatile memories", http://nvsl.ucsd.edu/ecc, printed Sep. 1, 2011. 2 pgs.

"The Non-Volatile Systems Laboratory Moneta and Onyx: Very Fast SS", http://nvsl.ucsd.edu/moneta/, 3 pgs., Sep. 1, 2011.

"The Non-Volatile Systems Laboratory NV-Heaps: Fast and Safe Persistent Objects", http://nvsl.ucsd.edu/nvuheaps/, 2 pgs., Sep. 1, 2011.

Akel et al., "Onyx: A Prototype Phase Change Memory Storage Array," https://www.flashmemorysummit.com/English/Collaterals/Proceedings/2011/Pr-oceedings.sub.--Chrono.sub.--2011.html, Flash Memory Summit 2011 Proceedings, Aug. 11, 2011.

Bailey et al., "Operating System Implications of Fast, Cheap, Non-Volatile Memory" 13th USENIX, HOTOS11 2011, May 9-11, 2011, 5 pages.

Caulfield et al., "Moneta: A High-performance Storage Array Architecture for Next-generation, Non-volatile Memories", MICRO 43: Proceedings of the 43rd Annual IEEE/ACM International Symposium on Microarchitecture, Atlanta, GA Dec. 2010 pp. 385-395.

Chen et al, "Rethinking Database Algorithms for Phase Change Memory", 5th Biennial Conference on Innovative Data Systems Research {CIDR '11 }, Jan. 9 2011, 11 pgs., Asilomar, California, USA.

Condit et al, "Better I/0 Through Byte-Addressable, Persistent Memory", SOSP '09, Oct. 11, 2009, pp. 133-146. Big Sky, Montana, USA.

Dhiman, et al."PDRAM: A Hybrid PRAM and DRAM Main Memory System", Jul. 26, 2009, Department of Computer Science and Engineering, 6 pages.

Freitas et al., "Storage-class memory: The next storage system technology", IBM J. Res. & Dev., Jul./Sep. 2008, pp. 439-447, vol. 52, No. 4/5.

Jacob, "The Memory System You Can't Avoid It, You Can't Ignore It, You Can't Fake It," Morgan & Claypool, Synthesis Lectures on Computer Architecture, vol. 4, No. 1, pp. 1-77, Jun. 2009.

Kant, Dr. Krishna, "Exploiting NVRAM for Building Multi-Level Memory Systems", InternationalWorkshop on Operating System Technologies for Large Scale NVRAM, Oct. 21, 2008, Jeju, Korea, 19 pages.

Lee et al., "Architecting Phase Change Memory as a Scalable DRAM Alternative", ISCA '09 Proceedings of the 36th Annual International Symposium on Computer Architecture, pp. 2-13, Jun. 20-24, 2009.

Mearian, "IBM announces computer memory breakthrough Phase-change memory offers 100 times the write performance of NANO flash", Jun. 30, 2011, 3 pgs.

Mogul et al., "Operating System Support for NVM+DRAM Hybrid Main Memory", 12th Workshop on Hot Topics in Operating Systems {HatOS XII), May 18, 2009, 9 pgs.

Quereshi et al., "Scalable High Performance Main Memory System Using Phase-Change Memory Technology", ISCA '09, Jun. 20, 2009, 10 pgs., Austin, Texas, USA.

Raoux et al., "Phase-Change Random Access Memory: A Scalable Technology," IBM Journal of Research and Development, vol. 52, Issue 4, pp. 465-479, Jul. 2008.

Wu et al., "eNVy: A Non-Volatile, Main Memory Storage System," ASPLOS VI Proceedings of the Sixth International Conference on Architectural Support for Programming Languages and Operating Systems, 12 pages, Oct. 1994.

* cited by examiner

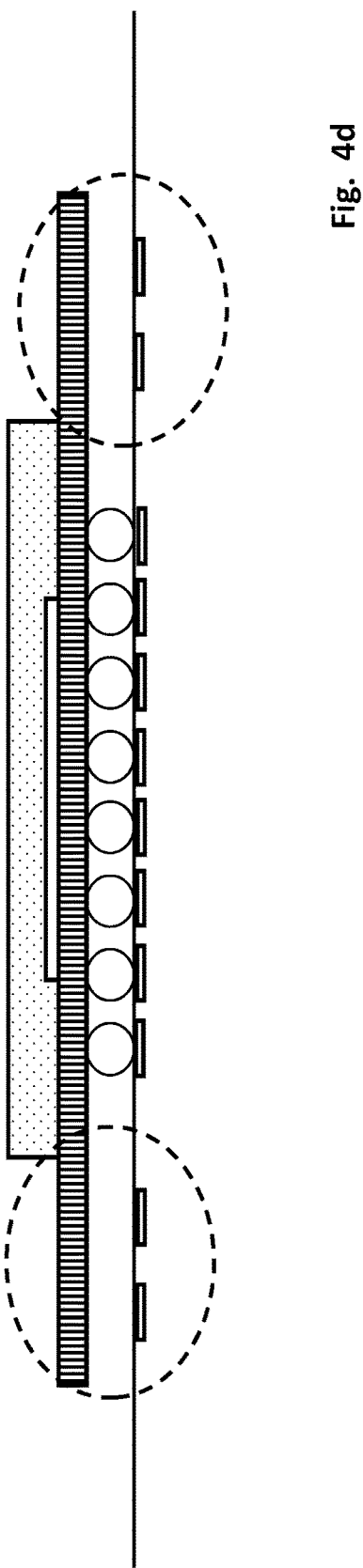

I/O LAYOUT FOOTPRINT FOR MULTIPLE 1LM/2LM CONFIGURATIONS

FIELD OF INVENTION

The field of the invention pertains generally to the computing sciences and, more specifically, to an Input/Output layout footprint for multiple 1Level Memory/2Level Memory configurations.

BACKGROUND

System memory, also referred to as main memory, is a pertinent part of a computing system as it holds the program code instructions and data of the software that is actively being executed by the computing system's Central Processing Units and may also be used to store other pertinent data that is actively being used or may soon be actively used by another component within the computing system. As such, system designers are highly motivated to improve system memory raw performance, cost performance and/or power consumption performance.

FIGURES

A better understanding of the present invention can be obtained from the following detailed description in conjunction with the following drawings, in which:

FIG. 4d shows coupling of a lower package to a system substrate;

DETAILED DESCRIPTION 1.0 Multi-Level System Memory

Figure 1:
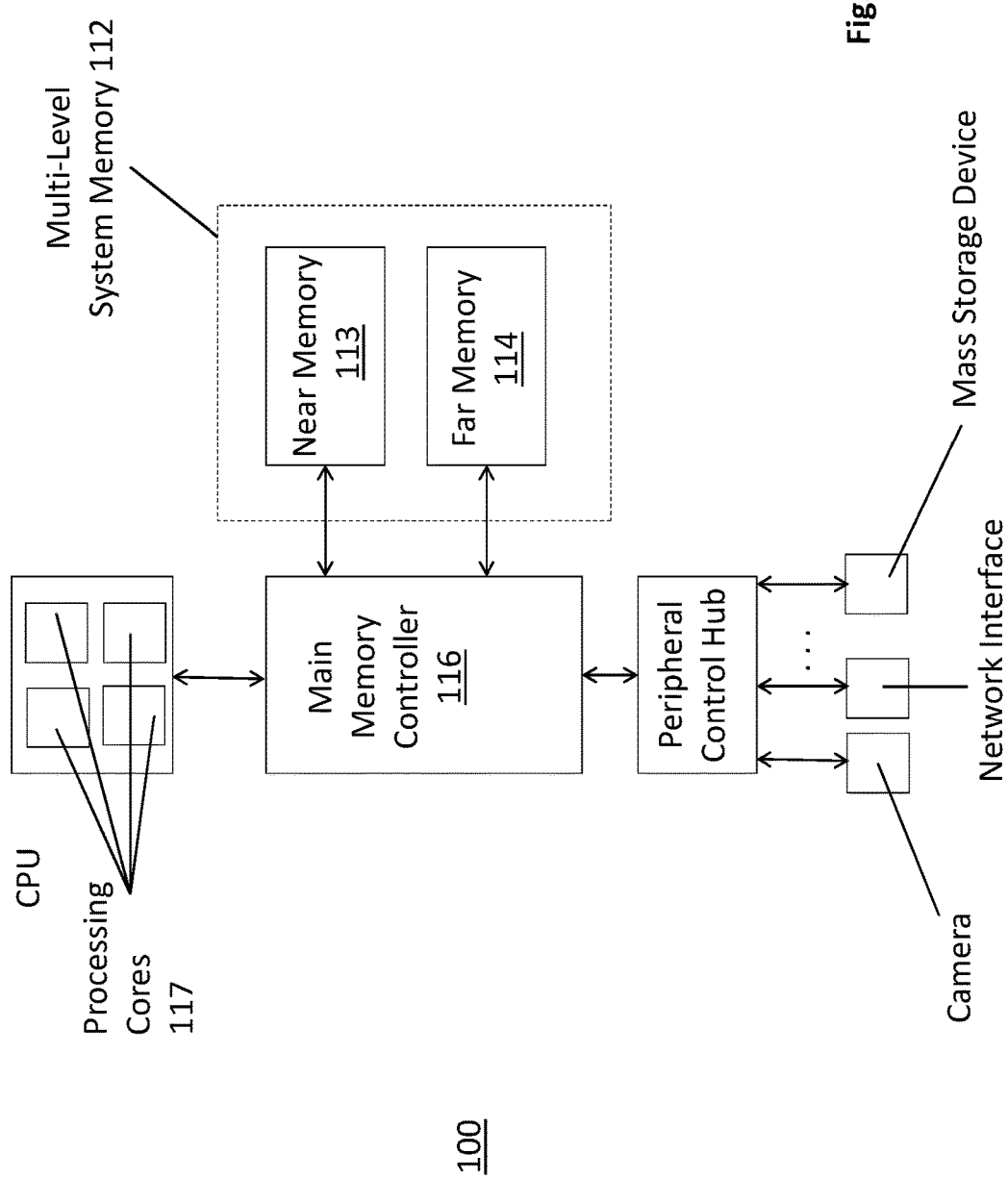
FIG. 1 shows a multi-tiered system level memory.

One of the ways to improve system memory performance is to have a multi-level system memory. FIG. 1 shows an embodiment of a computing system 100 having a multi-tiered or multi-level system memory 112 that includes a "near memory" composed of, e.g., faster memory devices, that are architecturally closer to the processing cores/CPU 117 and a "far memory" 114 composed of, e.g., slower memory devices that are architecturally farther away from the processing cores/CPU 117.

Here, architectural closeness or farness may be implemented in various ways. In one instance, the near memory devices 113 are allocated their own unique system memory address space which is understood (e.g., by lower level software such as a basic input/output system (BIOS), firmware, a virtual machine monitor, one or more virtual machines, one or more operating system instances, etc.) to be higher priority than other system memory addresses.

Here, the lower access times of the near memory 113 causes higher priority and/or higher performance program code to be allocated system memory address space in near memory 113 so that the program code executes from the faster memory device. By contrast, the slower far memory 114 is allocated system memory address space that is not higher priority and therefore lesser priority and/or lower performance program code is allocated far memory system memory address space so that such program code executes from the slower memory devices.

Another example of architectural closeness or farness is realized if near memory 113 is implemented as a cache. According to various embodiments, a smaller near memory 113 may be utilized as a cache for a larger far memory 114. Here, near memory 113 is used to keep, e.g., an additional copy of those data items stored in far memory 114 that are expected to be more frequently called upon by the computing system. With the near memory cache 113 having lower access times than the slower far memory 114 region, the multi-level system memory 112 will be observed as faster because the system will often read items or write to items that are being stored in the faster near memory cache 113.

In the case where near memory 113 acts as a "memory side" cache for far memory 114, the near memory 113 may be used slightly differently than a CPU level cache in that the entries (e.g., cache lines) of data that are more frequently written to and/or read from system memory 112 are present in near memory 113, whereas, in the case of a CPU level cache, entries of data that are more frequently written to and/or read by the processing cores/CPU 117 are present in a CPU level cache (computing systems often have multiple levels of CPU caches where cache lines that are most frequently accessed by the cores/CPU 117 are kept in the highest level CPU caches while lesser accessed cache lines are kept in lower level CPU caches). The distinction between a memory side cache and a CPU level cache is particularly noticeable if the computing system includes components other than the cores/CPU 117 that heavily use system memory (e.g., a graphics processor). Conceivably, some or all of near memory 113 could be used to implement a last level CPU cache. Different types of near memory caching architectures are possible (e.g., direct mapped, set associative, etc.).

In yet other approaches, the multi-level system memory 112 embraces both techniques above in which some of the storage space of near memory 113 is allocated unique (e.g., higher priority) system memory address space whereas other storage space of near memory 113 is used to implement a memory side cache for far memory 114.

According to various embodiments, near memory 113 exhibits reduced access times by having a faster clock speed than far memory 114. Here, near memory 113 may be implemented with faster (e.g., lower access time), volatile system memory technology (e.g., high performance dynamic random access memory (DRAM)) and/or static random access memory (SRAM) memory). By contrast, far memory 114 may be implemented with a volatile memory technology having a slower clock speed (e.g., a DRAM component that receives a slower clock) or, e.g., a non-volatile memory technology that may be slower (e.g., longer access time) than volatile/DRAM memory (or whatever technology is used for near memory).

For example, far memory 114 may be comprised of an emerging non-volatile random access memory technology such as, to name a few possibilities, a phase change based memory, a three dimensional crosspoint memory technology, or other byte addressable nonvolatile memory devices such as memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product.

In some embodiments, three dimensional crosspoint memory may comprise a transistor-less stackable cross point architecture in which memory cells sit at the intersection of word lines and bit lines and are individually addressable and in which bit storage is based on a change in bulk resistance.

Such emerging non-volatile random access memory technologies typically have some combination of the following: 1) higher storage densities than DRAM (e.g., by being constructed in three-dimensional (3D) circuit structures (e.g., a crosspoint 3D circuit structure)); 2) lower power consumption densities than DRAM (e.g., because they do not need refreshing); and/or, 3) access latency that is slower than DRAM yet still faster than traditional non-volatile memory technologies such as FLASH. The latter characteristic in particular permits various emerging byte addressable write-in-place non-volatile memory technologies to be used in a main system memory role rather than a traditional mass storage role (which is the traditional architectural location of non-volatile storage). Being system memory devices rather than traditional mass storage devices, such emerging non-volatile random access memory devices are also byte addressable (e.g., a cache line of data can be updated/written to with just a byte of information) instead of being limited to block based accesses. In various embodiments, in the case where far memory 114 is non-volatile, battery backed up DRAM may also be used (but may have, e.g., a slower clock than near memory DRAM devices).

Regardless of whether far memory 114 is composed of a volatile or non-volatile memory technology, in various embodiments far memory 114 acts as a true system memory in that it supports finer grained data accesses (e.g., cache lines) rather than larger based accesses associated with traditional, non-volatile mass storage (e.g., solid state drive (SSD), hard disk drive (HDD)), and/or, otherwise acts as an (e.g., byte) addressable memory that the program code being executed by processor(s) of the CPU operate out of.

Far memory devices may be coupled to their own unique memory channel that emanates from the main memory controller 116, or, both near memory devices and far memory devices may be coupled to a same memory channel that emanates from the main memory controller 116. In either of these approaches, the memory channel may be an industry standard system memory channel such as a double data rate (DDR) memory channel published by an industry standards organization (such as the Joint Electron Device Engineering Council (JEDEC) s uch as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.ord). Such standards (and similar standards) may be referred to as DDR-based standards and communication interfaces of the storage devices that implement such standards may be referred to as DDR-based interfaces. The near memory and/or far memory devices may be integrated in a same multi-chip module as the processing cores/CPU 117 and/or main memory controller 116, or, may be integrated outside such a module or other package that contains the cores/CPU 117 and/or main memory controller 116.

The far memory devices 114 may be coupled directly to a far memory controller (not shown in FIG. 1 for illustrative ease) that resides between the far memory devices and the main memory controller 116. The far memory controller performs various tasks that are, e.g., specific to emerging non-volatile memory devices that are used for far memory. For example, the far memory controller may apply signals to the far memory devices having special voltages and/or timing requirements, may manage the movement/rotation of more frequently accessed data to less frequently accessed storage cells (transparently to the system's system memory addressing organization from the perspective of the processing cores under a process known as wear leveling) and/or may identify groups of bad storage cells and prevent their future usage (also known as bad block management).

The host side memory controller may be able to communicate to multiple far memory controllers and corresponding far memory devices as memory expansion "plug-ins". In various embodiments, the memory expansion plug-in solutions may be implemented with point-to-point links (e.g., one PCIe link per plug-in) or multi-drop bus (e.g., industry standard DDR memory channel). Non expanded far memory (provided as part of the basic original system) may or may not be implemented with point-to-point links.

The same types of non-volatile memory devices that are used to implement far memory 114 may also be used to implement block accessible mass storage, e.g., as a form of solid state drive (SSD) within the larger computing system.

2.0 I/O Layout Footprint for Multiple 1LM/2LM Configurations

Although there exist various motivations for a multi-tiered system memory, as the technology is currently emerging, there remains substantial expected demand for traditional single level main memory (1LM) systems. As such, system designers may desire to develop underlying hardware platforms that support either 1LM or 2LM configurations. For example, a computing system manufacturer or computing system component manufacturer may desire to have a common 1LM/2LM platform that can be retrofitted to implement either a 1LM or 2LM system. Here, for instance, customers may order 1LM or 2LM systems and the manufacturer need only populate 1LM components or 2LM components on the same common platform to serve the customer orders.

Figure 2A:
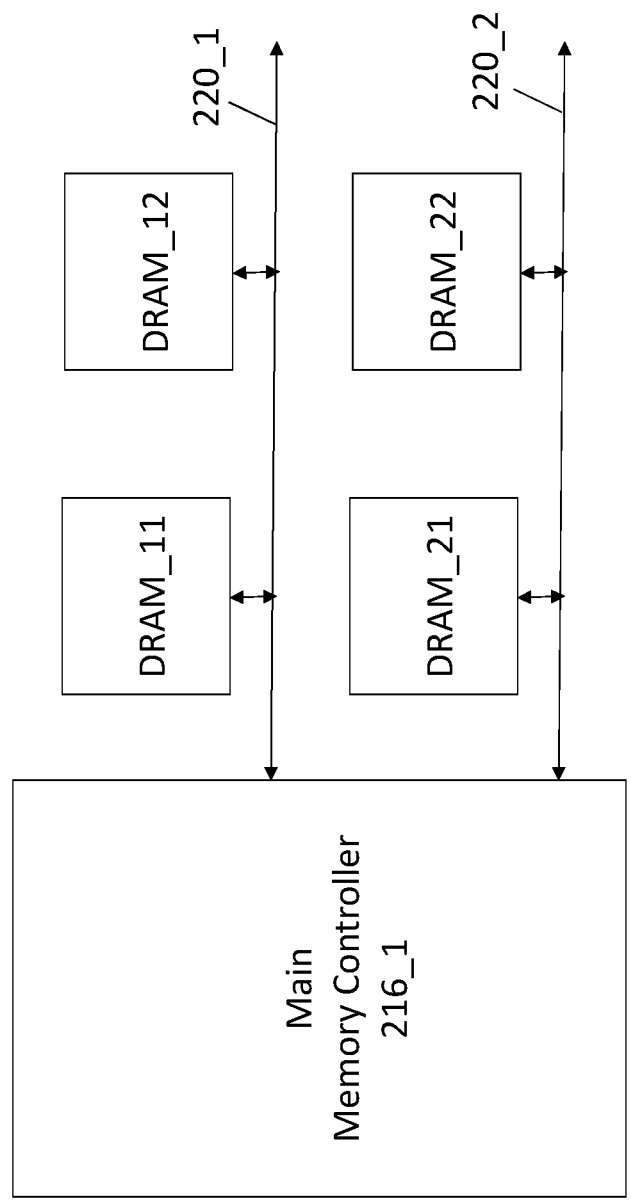
FIG. 2a shows a 1LM configuration.

FIGS. 2a through 2d explore different possible physical implementations of 1LM and 2LM systems that a common underlying 1LM/2LM hardware platform may be asked to support manufacture of. FIG. 2a shows a 1LM system composed of multiple system memory channels 220_1, 220_2 and corresponding DRAM devices that are coupled to the memory channels 220_1, 220_2. Here, as the system is a 1LM system, no non-volatile system memory components are observed.

Figure 2B:
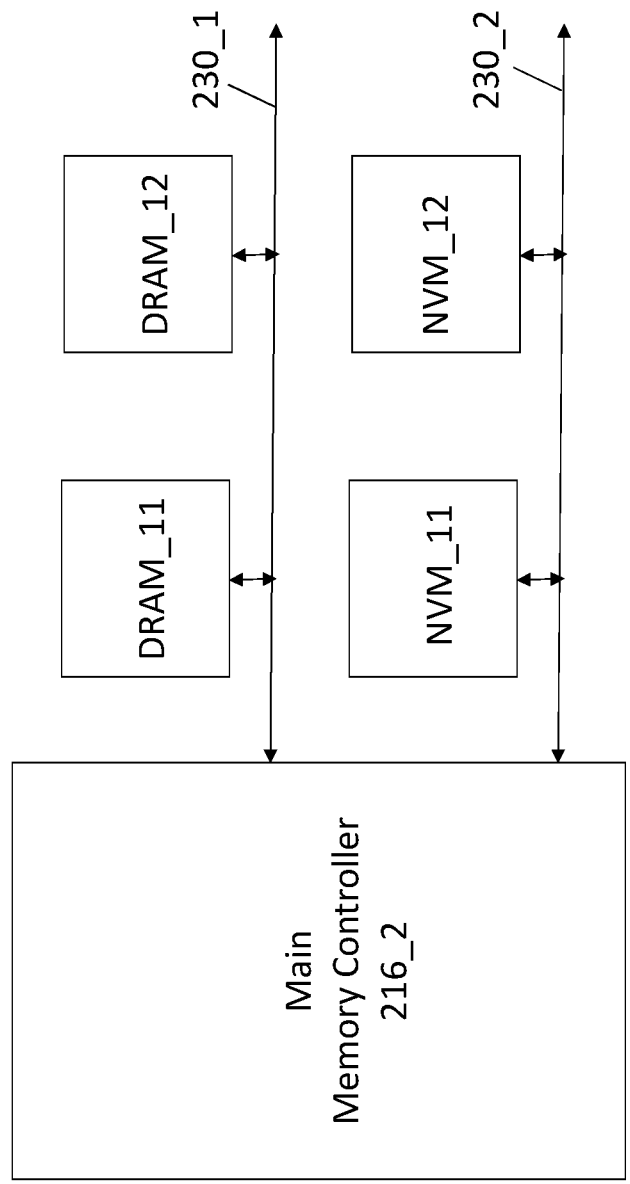
FIG. 2b shows a first 2LM configuration.

FIG. 2b shows a first 2LM configuration in which DRAM devices are coupled to a first system memory channel 230_1 and non-volatile system memory devices are coupled to a second memory channel 230_2. Here, depending on implementation, both memory channels 230_1, 230_2 may be a same type of memory channel or may be different types of system memory channels. If they are different, the difference may be more associated with the protocol (the physical interfaces/specifications of the memory channels are the same) or they may having different physical interfaces (e.g., a DRAM device does not mechanically or electrically couple to a non-volatile memory channel).

FIG. 2b may also correspond to a 1LM system in which the first channel corresponds 230_1 to a system memory channel (to which only DRAM devices are coupled) whereas the second "channel" 230_2 corresponds to some peripheral interface rather than a system memory interface. For example, the peripheral interface may be a solid state drive interface and the non-volatile memory devices act as mass storage for the computing system rather than system memory. Some such interfaces may only couple to one non-volatile device (rather than more than one as depicted in FIG. 2b).

Figure 2C:
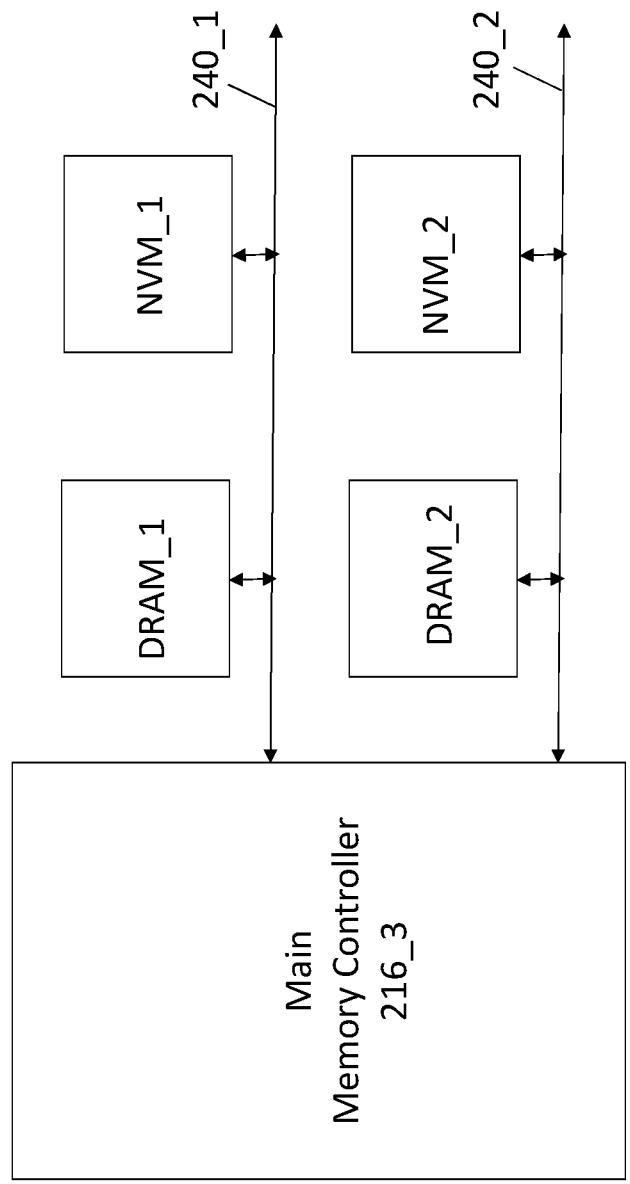
FIG. 2c shows a second 2LM configuration.

FIG. 2c shows a second 2LM configuration. In the configuration of FIG. 2c, DRAM devices and non-volatile system memory devices are permitted to be coupled to a same memory channel but remain in different packages. That is, for instance, only stacked DRAM devices may exist in first semiconductor chip package and only stacked far memory devices may be stacked in a second semiconductor chip package.

Figure 2D:
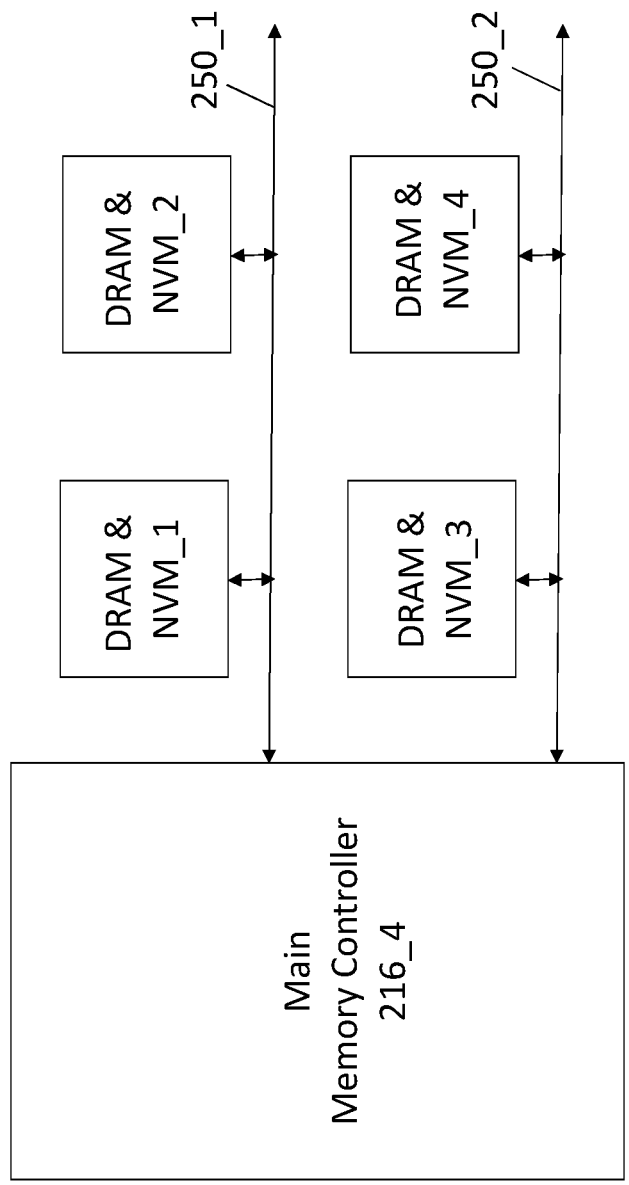
FIG. 2d shows a third 2LM configuration.

FIG. 2d shows a third 2LM configuration. In the configuration of FIG. 2d, DRAM devices and non-volatile system memory devices are integrated into a same package or otherwise share a same footprint surface area. That is, for example, both DRAM and far memory devices are integrated together as different parts of a same component that is, e.g., mounted to a system board.

Figure 3:
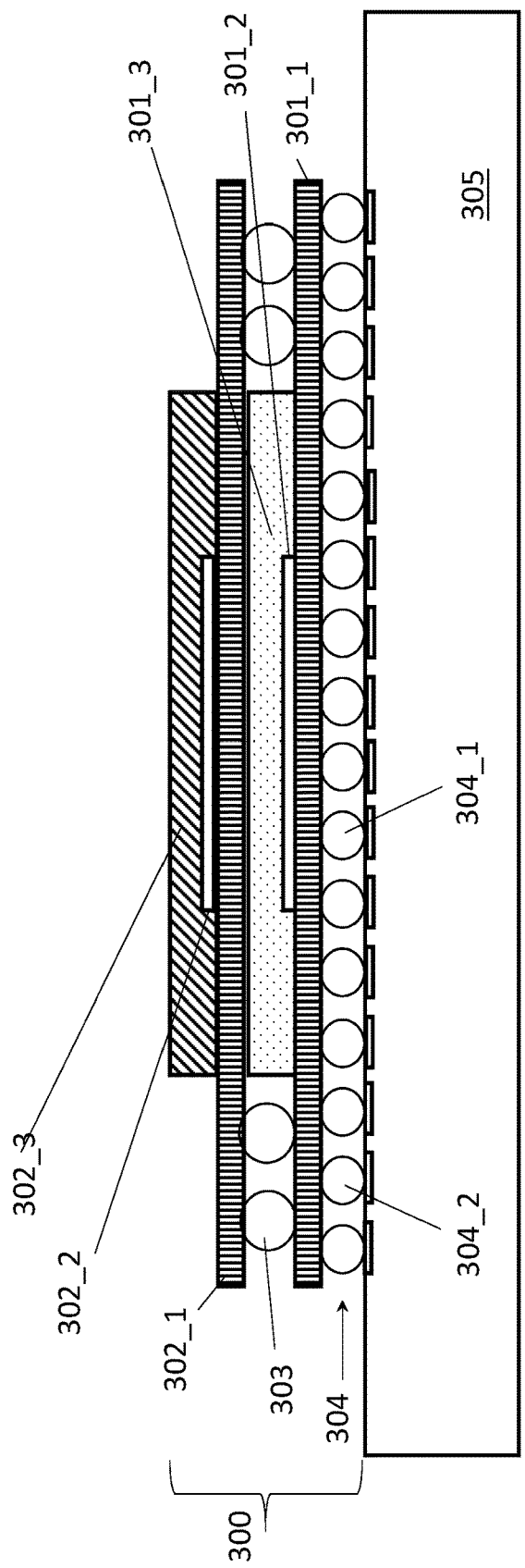
FIG. 3 shows a package-on-package structure (prior art)

FIG. 3 shows a standard, prior art package-on-package (POP) structure 300. As observed in FIG. 3, a standard POP structure includes a first bottom package 301 composed of lower substrate 301_1 and lower semiconductor chip 301_2 that is hermetically sealed in a lower encapsulant 301_3. Typically, pads on the upper surface of the lower substrate 301_1 align and are soldered to pads or micro-balls on the underside of the lower semiconductor chip 301_2 to form electrical I/O connections between the lower substrate 301_1 and the lower semiconductor chip 301_2. As such, both the lower semiconductor chip 301_2 and the lower encapsulant 301_3 are fixed to the lower substrate 301_1.

An upper package 302 is mounted on the bottom package 301. The upper package 302 is composed of an upper substrate 302_1 and semiconductor chip 302_2 that is hermetically sealed in an upper encapsulant 302_3. Typically, pads on the upper surface of the upper substrate 302_1 align and are soldered to pads or micro-balls on the underside of the upper semiconductor chip 302_2 to form electrical I/O connections between the upper substrate 302_1 and the upper semiconductor chip 302_2. As such, both the upper semiconductor chip 302_2 and the upper encapsulant 302_3 are fixed to the upper substrate 302_1.

The substrates for both the upper and lower packages 301, 302 are typically composed of PC board material (e.g., FR4, ceramic, phenolic, etc.). The encapsulants for both packages 301, 302 are typically composed of a plastic or epoxy.

I/O solder balls 303 on the underside of the upper substrate 302_1 bond to pads that are formed on the top side of the lower substrate 301_1. Solder balls 304 to implement I/O connections to a lower system substrate 305 for both the upper and lower packages 301, 302 are mounted on the underside of the lower substrate 301_1. The system substrate 305 may correspond, e.g., to a computing system motherboard, riser plane for a CPU and/or system memory complex, substrate of a multi-chip module, etc. The system substrate 305 is typically composed of PC board material.

The wiring within the lower substrate 301_1 of the POP structure 300 is designed to not only carry signals between the system substrate 305 and the lower semiconductor die 301_1 but also the system substrate 305 and the upper semiconductor die 301_2. Importantly, the wiring is viewed from the perspective that the entire POP structure 300 is a single component. As such, it is common to find I/O connections amongst the lower solder balls 304 for both the upper and lower packages 301, 302 to be uniformly dispersed on the underside of the lower substrate 301_1.

That is, for example, lower I/O solder balls 304 that connect to the system substrate 305 for establishing an electrical connection to the upper die 302_2 may reside directly beneath the lower die 301_2 and/or, lower I/O solder balls 304 that connect to the system substrate 305 for establishing an electrical connection to the lower die 301_2 may reside outside the periphery of the lower die 301_2 (e.g., around the outer periphery of the lower substrate 301_2). For example, lower solder ball 304_1 may be an I/O connection for the upper die 302_2 and lower solder ball 304_2 may be an I/O connection for the lower die 301_2.

Figure 4A:
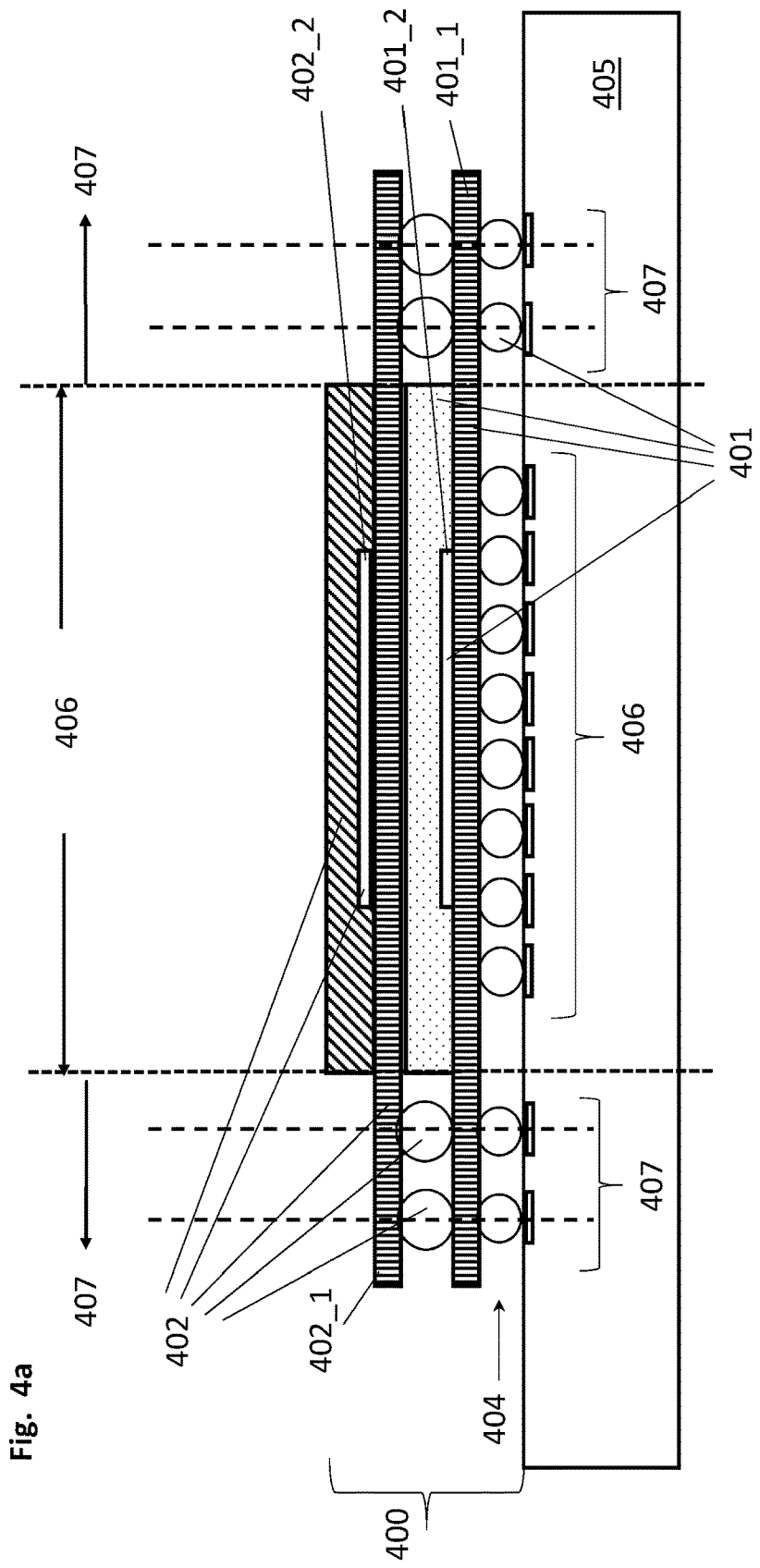
FIG. 4a shows a 1LM/2LM compatible package-on-package structure.

By contrast, FIG. 4a shows a new POP structure 400 in which the lower I/O solder ball connections 404 are segregated such that lower I/O solder balls 404 that connect to the system substrate 405 for establishing a connection to the lower die 401_2 are centrally located 406 on the underside of the lower substrate 401_1, whereas, lower I/O solder balls 404 that connect to the system substrate 405 for establishing a connection to the upper die 402_2 are peripherally located 407 on the underside of the lower substrate 401_1, e.g., around the I/O solder balls for the lower die 4012.

For ease of drawing FIG. 4a shows only one die in the lower package structure 401 and only one die in the upper package structure 402. However, as both the lower and upper package structures 401, 402 are to contain memory devices, in various embodiments, both the upper and the lower package structures 401, 402 contain stacked memory devices. In further embodiments, one of the package structures is reserved for non-volatile system memory devices and may also contain a far memory controller (stacked along with stacked non-volatile system memory devices) as discussed above with respect to FIG. 1.

FIG. 4a shows just one particular embodiment in which the upper package structure's system level I/O solder balls remain outside the periphery 407 of the encapsulant 401_3 of the lower package structure. However the reader will understand this is just one embodiment and alternate embodiments where these solder balls may fall inside this periphery or remain farther outside this periphery. In various embodiments, as observed in FIG. 4a, the solder ball I/Os on the underside of the upper substrate 402_1 are vertically aligned with the pads on the lower substrate 405 that they are electrically connected to within the POP structure so that they could properly mate to them if the lower package 401 was not present.

The system substrate 405 may correspond, e.g., to a computing system motherboard, riser plane for a CPU and/or system memory complex, substrate of a multi-chip module, etc. The system substrate 405 may also correspond to the card/board material for a dual in line memory module (DIMM) that, e.g., plugs into a computing system main memory channel. The system substrate 405 is composed of PC board material in various embodiments.

Figure 4B:
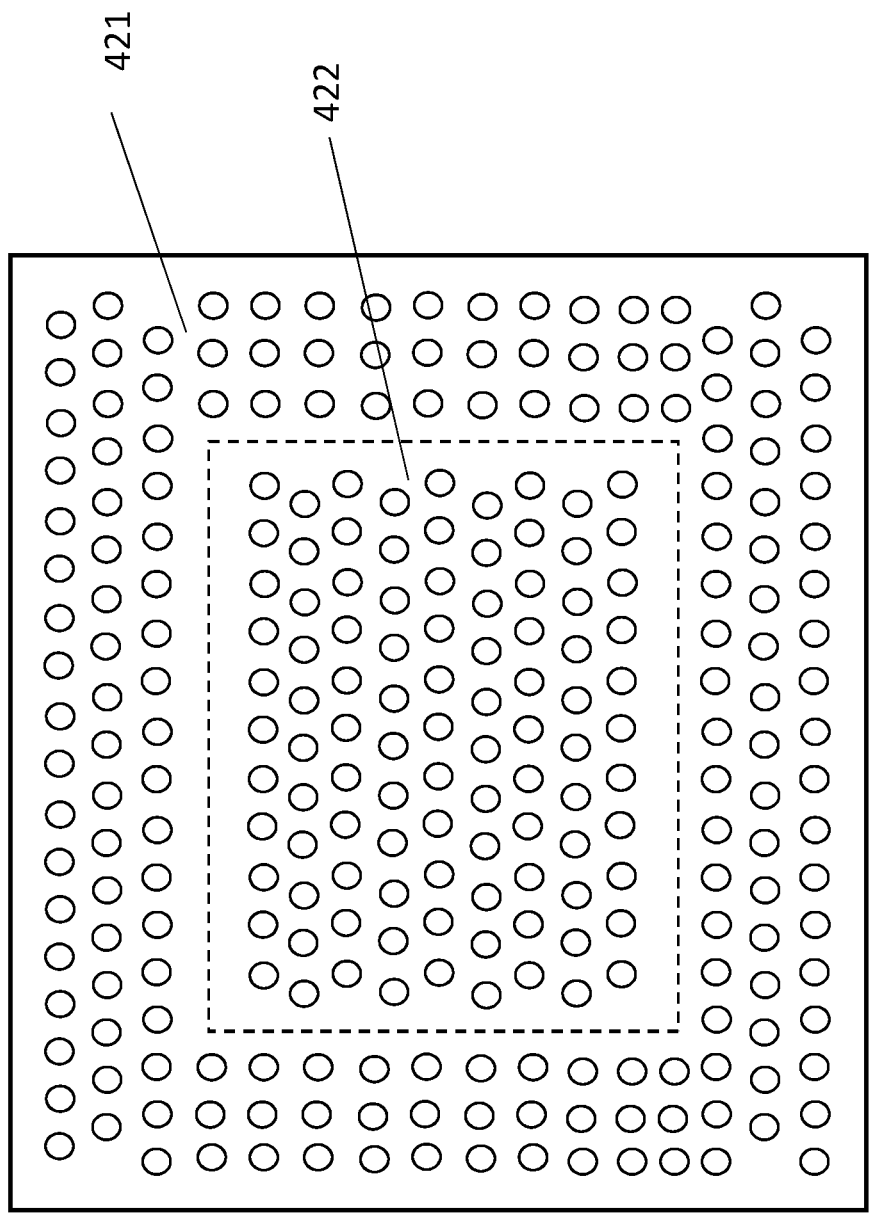
FIG. 4b shows an I/O layout footprint.

FIG. 4b shows an embodiment of the I/O solder ball footprint on the underside of the lower substrate 401_1, or, the I/O pad footprint on the upper surface of the system substrate 405. Here, outer pad/ball locations 421 are reserved for the I/O connections of the upper package structure and inner pad/ball locations 422 are reserved for the I/O connections of the lower package structure. As will be explained in more detail below, confining the area of the I/O connections for the lower package structure such that they remain inside, or closer to the middle point of the overall footprint at least than the I/O connections for the upper package structure provides for particularly efficient layout efficiencies in terms of the number of different types of package populations that can be supported without changing the I/O footprint layout of the system substrate 405, lower substrate 401_1 of the lower package structure 401 and lower substrate 402_1 of the upper package structure.

Figure 4C:
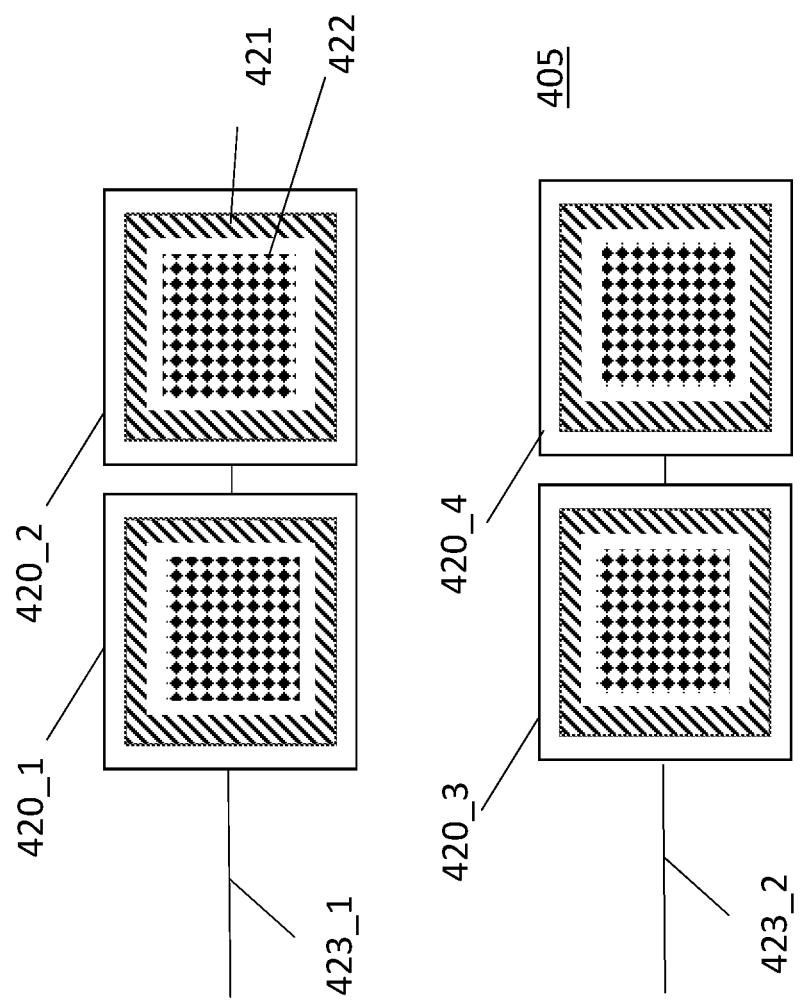
FIG. 4c shows a memory system substrate footprint.

FIG. 4c shows an exemplary top down view of the I/O pad layout for a system substrate 405. As observed in FIG. 4c, two layout pad footprints 420_1, 420_2 of the kind like that displayed in FIG. 4b are depicted as being coupled to the wiring of a first memory channel 423_1 and another two layout pad footprints 420_3, 420_4 of the kind like that displayed in FIG. 4b are depicted as being coupled to the wiring of a second memory channel 423_2. Here, the pads for connection to an upper package are labeled as outer pads 421 and the pads for connection to a lower package are labeled as inner pads 422.

According to the particular embodiment of FIG. 4c, the layout supports a multi-drop bus in which the pads for two sets of upper and lower packages (that respectively connect to footprints 420_1 and 420_2) connect to memory channel 423_1 and in which the pads for two more sets of upper and lower packages (that respectively connect to footprints 420_3 and 420_4) connect to memory channel 423_2. In other embodiments, each footprint may be coupled to its own respective memory channel (in which case a multi-drop bus is formed in which one lower package and one upper package connect to), or, one or more outer I/Os 422 may connect to a first memory channel, or, one or more inner I/Os 422 may connect to a second memory channel. In even further embodiments, one or more of the aforementioned memory channels may instead be implemented as the wiring for a peripheral device interface, e.g., to the extent that connection to non-volatile memory devices is intended.

Regardless of the particular physical layout approach that is undertaken, it is pertinent to point out that lower packages and/or upper packages can be fitted to the layout of FIG. 4c, as a combined POP structure or as individual packages without requiring any change to the layout of the system substrate 405. As such, a vast array of 1LM or 2LM configurations can be implemented by populating specific types of memory devices to the system substrate 405 without any large effect of overall layout efficiency because, e.g., the outer I/O connections 421 do not consume much surface area beyond the surface area of the inner I/O connections 422.

Referring to FIGS. 4a and 2d, note that the particular package structure of FIG. 4a provides for easy and straightforward implementation of the 2LM system of FIG. 2d. That is, both DRAM and non-volatile system memory devices are integrated in the same POP structure with, e.g., DRAM devices being within the lower package structure and, e.g., non-volatile system memory devices being integrated in the upper package structure. Here, using FIG. 4c as a reference, the DRAM devices of the lower package structures would couple to the inner I/Os 422 and the non-volatile memory devices of the upper package would coupled to the outer I/Os 421.

However, the overall layout and design of FIG. 4a for each of the system substrate 405, lower package 401 and upper package 402 also lends itself to any of the configurations of FIGS. 2a through 2c by populating the correct package onto the system substrate. For example, FIG. 4d shows that just a lower package of DRAM devices can be used to implement a separate DRAM device as depicted in any of FIGS. 2a, 2b and 2c. That is, e.g., each of the depicted DRAM devices in any of FIGS. 2a, 2b and 2c can be implemented as the DRAM device of FIG. 4d without any change to the layout of the pads on the system substrate or any change the solder balls locations on the underside of the lower substrate of the lower package structure.

Here, in the case of FIG. 2a, each of the inner I/Os of a DRAM package couple to the inner pads of the system substrate footprint layout. As can be seen, a set of such I/Os for different DRAM packages may couple to a same memory channel or a different memory channel. The same can be said for the implementation of FIG. 2b provided DRAM packages and non-volatile memory packages do not couple to a same memory channel (multiple DRAM and non-volatile memory channels may exist in the system).

Figure 4E:
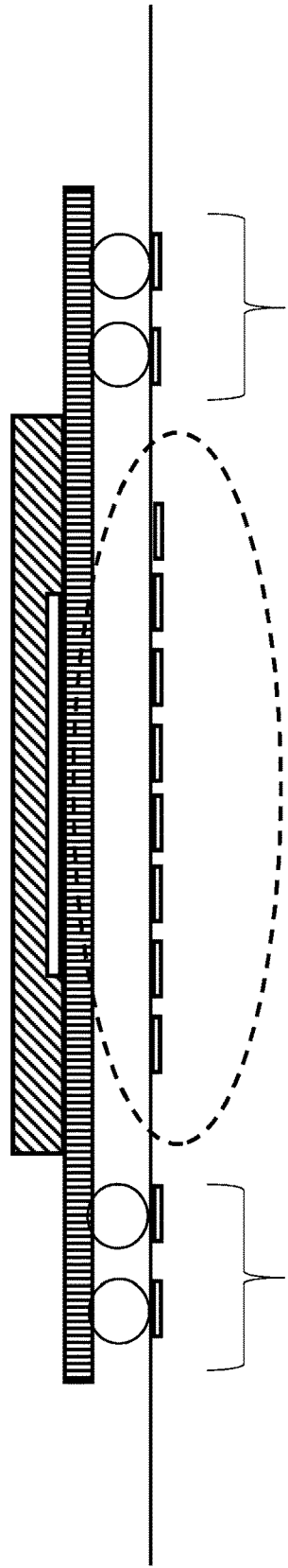
FIG. 4e shows coupling of an upper package to a system substrate.

FIG. 4e shows how the same system substrate layout can also support connection to a non-volatile memory device by itself as well. That is, whereas FIG. 4d shows the coupling of only a lower DRAM package, by contrast, FIG. 4e shows the coupling of only a non-volatile memory upper package. As such, not only may the implementation of FIG. 4d be used to implement the DRAM devices of FIG. 2b, but also, the implementation of FIG. 4e may be used to implement the non-volatile system memory devices of FIG. 2b. Here, with repeated instances of the system substrate pad layout along each of the memory channels as depicted in FIG. 4c, some of the memory channels are populated with DRAM devices to implement a near memory channel whereas other memory channels are populated with non-volatile memory devices to implement a far memory channel.

The same principles as described above for the configuration of FIG. 2b also apply to FIG. 2c except that the DRAM memory devices (e.g., as implemented as depicted in FIG. 4b) and non-volatile memory devices (e.g., as implemented in FIG. 4c) can be coupled to the same memory channel. Again, no change in substrate board layout is required. The only variant which types of devices are coupled to which pad I/Os on the system substrate.

Systems having different ratios of near memory space to far memory space can be implemented by populating more or less of the available memory channels of the system substrate with DRAM devices or non-volatile memory devices. For example, a system substrate having five unpopulated memory channels can populate one of the channels with DRAM devices and four of the channels with non-volatile memory devices, whereas, another instance of the same system substrate can populate two of the channels with the DRAM devices and three of the channels with non-volatile memory devices to effect a different ratio of near memory space to far memory space.

In yet another approach, such different ratios may be effected by populating more or less DRAM devices on a same memory channel. For example, a first footprint on a memory channel may be populated with a full combined POP structure as depicted in FIG. 4a whereas another second footprint coupled to the same memory channel may be coupled only to an upper package non-volatile memory device package as observed in FIG. 4e to effect a first DRAM to non-volatile memory ratio on the channel. By contrast, both footprints of the same memory channel of another instance of the system substrate can be populated with a full POP structure as observed in FIG. 4a to effect a higher ratio of DRAM to non-volatile memory on the memory channel.

In some implementations, less stacked non-volatile memory chips and/or stacked DRAM memory chips may be achievable in the upper and/or lower package structures respectively for the POP structure than for either package structure alone for thermal constraint reasons. Nevertheless, the I/O layouts for the system substrate and package substrates need not be affected. Also, although in embodiments above the DRAM devices were integrated within the lower package structure and the non-volatile memory devices were integrated within the upper package structure, by contrast, in alternative implementations the memory technologies may be swapped such that non-volatile memory devices reside in the lower package structure and DRAM devices reside in the upper package structure.

Figure 5:
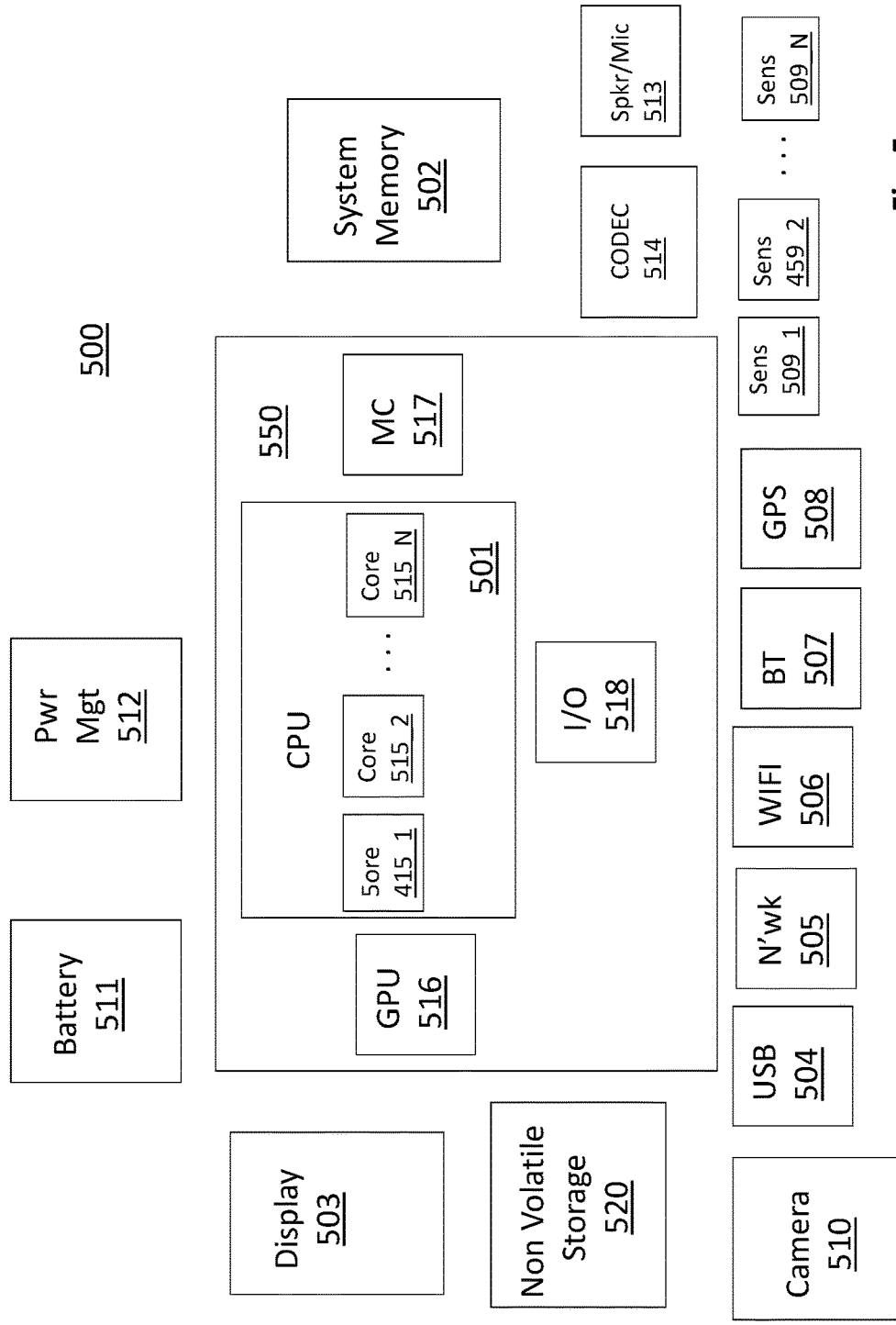
FIG. 5 shows a computing system.

FIG. 5 shows a depiction of an exemplary computing system 500 such as a personal computing system (e.g., desktop or laptop) or a mobile or handheld computing system such as a tablet device or smartphone, or, a larger computing system such as a server computing system.

As observed in FIG. 5, the basic computing system may include a central processing unit 501 (which may include, e.g., a plurality of general purpose processing cores and a main memory controller disposed on an applications processor or multi-core processor), system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_N (e.g., one or more of a gyroscope, an accelerometer, a magnetometer, a temperature sensor, a pressure sensor, a humidity sensor, etc.), a camera 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing units 516 typically execute graphics intensive functions to, e.g., generate graphics information that is presented on the display 503. The memory control function 517, which may be referred to as a main memory controller or system memory controller, interfaces with the system memory 502. The system memory 502 may be a multi-level system memory, which, further, uses a common system substrate footprint and corresponding POP package structure as described at length above to implement various 2LM configurations and even 1LM configurations.

Each of the touchscreen display 503, the communication interfaces 504-507, the GPS interface 508, the sensors 509, the camera 510, and the speaker/microphone codec 513, 514 all can be viewed as various forms of I/O (input and/or output) relative to the overall computing system including, where appropriate, an integrated peripheral device as well (e.g., the camera 510). Depending on implementation, various ones of these I/O components may be integrated on the applications processor/multi-core processor 550 or may be located off the die or outside the package of the applications processor/multi-core processor 550. Non-volatile storage 520 may hold the BIOS and/or firmware of the computing system.

One or more various signal wires within the computing system, e.g., a data or address wire of a memory bus that couples the main memory controller to the system memory, may include a receiver that is implemented as decision feedback equalizer circuit that internally compensates for changes in electron mobility as described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

The invention claimed is:

1. An apparatus, comprising:
a package on package structure comprising an upper package and a lower package, one of the packages containing memory devices of a first type and the other of the packages containing memory devices of a second type, wherein, I/O connections on the underside of the upper package's substrate are vertically aligned with their corresponding, first I/O connections on the underside of the lower package's substrate, the first I/O connections located outside second I/O connections on the underside of the lower package's substrate for the lower package, and wherein, a distance between those of the I/O connections located on opposite sides of the lower package is less than twice a width of an encapsulated die within the lower package, wherein the memory devices of the first type are stacked and the memory devices of the second type are stacked.

2. The apparatus of claim 1 wherein the memory devices of the first type comprise DRAM.

3. The apparatus of claim 1 wherein the memory devices of the second type are non-volatile.

4. The apparatus of claim 3 wherein the memory devices of the second type comprise any of:
a three dimensional cross point memory;
a phase change memory;
a magnetic memory;
a ferroelectric memory;
a resistive memory;
a spin transfer torque memory;
an Ovshinsky memory;
chalcogenide.

5. The apparatus of claim 3 wherein the memory devices of the second type are integrated in their respective one of the packages with a controller.

6. The apparatus of claim 1 wherein the upper package contains non-volatile memory devices and the lower package contains DRAM devices.

7. The apparatus of claim 1 wherein the first I/O connections on the underside of the lower package's substrate for the upper package and the second I/O connections on the underside of the other package's substrate are compatible with an industry standard system memory channel.

8. An apparatus, comprising:
a system substrate comprising a pad layout footprint, said pad layout footprint comprising outer pads to couple to an upper package of a package-on-package structure, said pad layout footprint comprising inner pads that remain within said outer pads, said inner pads to couple to a lower package of the package-on-package structure, wherein, said outer pads contain wiring of a first system memory channel, and, said inner pads contain wiring of said first system memory channel or a second system memory channel.

9. The apparatus of claim 8 wherein said system substrate is a motherboard of a computing system.

10. The apparatus of claim 8 wherein said system substrate is a substrate for a multi-chip module.

11. The apparatus of claim 8 wherein said system substrate is a DIMM substrate.

12. The apparatus of claim 8 further comprising only a lower package coupled to said pad layout footprint.

13. The apparatus of claim 8 further comprising only an upper package coupled to said pad layout footprint.

14. A computing system, comprising:
one or more processing cores;
a memory controller;
a system substrate comprising a pad layout footprint, said pad layout footprint comprising outer pads to couple to an upper package of a package-on-package structure, said pad layout footprint comprising inner pads that remain within said outer pads, said inner pads to couple to a lower package of the package-on-package structure, wherein, said outer pads contain wiring of a first system memory channel that is coupled to said memory controller, and, said inner pads contain wiring of said first system memory channel or a second system memory channel that is coupled to said memory controller.

15. The computing system of claim 14 wherein said system substrate is a motherboard of a computing system.

16. The computing system of claim 14 wherein said system substrate is a substrate for a multi-chip module.

17. The computing system of claim 14 wherein said system substrate is a DIMM substrate.

18. The computing system of claim 14 further comprising only a lower package or only an upper package coupled to said pad layout footprint.

19. The computing system of claim 14 further comprising the package on package structure coupled to said pad layout footprint, one of the packages containing memory devices of a first type and the other of the packages containing memory devices of a second type, wherein, I/O connections on the underside of the upper package's substrate are vertically aligned with the outer pads.

* * * * *